(12) United States Patent
Chang et al.

(10) Patent No.: US 9,507,449 B2
(45) Date of Patent: Nov. 29, 2016

(54) TOUCH-SENSITIVE DISPLAY DEVICE AND FABRICATION METHOD THEREFOR

(71) Applicant: Wintek Corporation, Taichung (TW)

(72) Inventors: Ting-Yu Chang, Feng Shan (TW);
Hen-Ta Kang, Tai Chung (TW);
Ching-Fu Hsu, Feng Yuan (TW);
Hsiao-Hui Liao, Taichung (TW)

(73) Assignee: WINTEK CORPORATION, Taichung (TW)

( * ) Notice: Subject to any disclaimer, the term of this patent is extended or adjusted under 35 U.S.C. 154(b) by 712 days.

(21) Appl. No.: 13/888,041

(22) Filed: May 6, 2013

(65) Prior Publication Data

US 2013/0293499 A1   Nov. 7, 2013

(30) Foreign Application Priority Data

May 7, 2012 (TW) .............................. 101116126 A

(51) Int. Cl.
*G06F 3/041* (2006.01)
*H01L 51/56* (2006.01)
*G06F 3/044* (2006.01)
*G09G 3/32* (2016.01)

(52) U.S. Cl.
CPC .............. *G06F 3/041* (2013.01); *G06F 3/044* (2013.01); *G06F 3/0412* (2013.01); *H01L 51/56* (2013.01); *G09G 3/3208* (2013.01); *G09G 2300/0426* (2013.01)

(58) Field of Classification Search
CPC .. G06F 3/0488; G06F 3/04883; G06F 3/044; G06F 3/0418
See application file for complete search history.

(56) References Cited

U.S. PATENT DOCUMENTS

| | | | | |
|---|---|---|---|---|
| 2005/0168491 | A1* | 8/2005 | Takahara | G09G 3/006 345/690 |
| 2007/0242055 | A1* | 10/2007 | Lai | G06F 3/0412 345/173 |
| 2010/0141630 | A1* | 6/2010 | Kimura | G09G 3/3233 345/211 |
| 2011/0037716 | A1 | 2/2011 | Lee et al. | |
| 2012/0267229 | A1* | 10/2012 | Lin | B29C 45/14639 200/600 |

FOREIGN PATENT DOCUMENTS

| | | |
|---|---|---|
| CN | 101894856 | 11/2010 |
| TW | I317086 | 11/2009 |
| TW | 201214359 A | 4/2012 |
| TW | 201215947 A | 4/2012 |

* cited by examiner

*Primary Examiner* — Andrew Sasinowski
*Assistant Examiner* — Mansour M Said
(74) *Attorney, Agent, or Firm* — Muncy, Geissler, Olds & Lowe, P.C.

(57) ABSTRACT

A touch-sensitive display device includes a substrate, an OLED structure and a cover plate. The OLED structure is disposed on the substrate and includes a first electrode layer, a light-emitting layer and a second electrode layer. The first electrode layer is disposed on the substrate, the light-emitting layer is disposed on the first electrode layer, and the second electrode layer is disposed on the light-emitting layer and patterned to form a plurality of touch-sensing electrodes. The cover plate is disposed opposite the substrate and spaced at an interval from the substrate, and the OLED structure is sealed between the substrate and the cover plate.

2 Claims, 6 Drawing Sheets

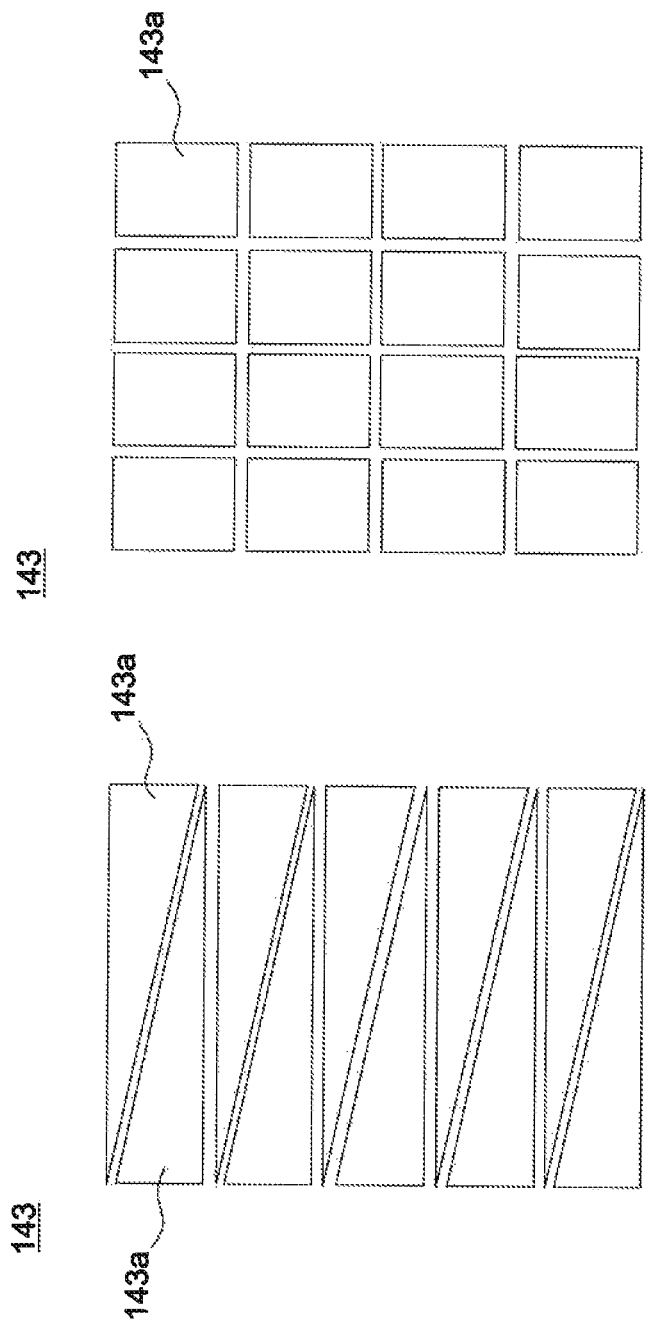

TOUCH-SENSITIVE DISPLAY DEVICE AND FABRICATION METHOD THEREFOR

BACKGROUND OF THE INVENTION a. Field of the Invention

The invention relates to a touch-sensitive display device and a fabrication method for the touch-sensitive display device.

b. Description of the Related Art

Typically, a touch-sensitive display device may include a display panel and a touch panel attached to the display panel and thus is comparatively thick and heavy. Besides, an external touch panel may lower the overall light transmittance of a touch-sensitive display device. However, these problems may be solved in case touch-sensing functions are directly integrated into a display device.

BRIEF SUMMARY OF THE INVENTION

The invention provides a thin touch-sensitive display device having high light transmittance.

Other objects and advantages of the invention can be better understood from the technical characteristics disclosed by the invention. In order to achieve one of the above purposes, all the purposes, or other purposes, one embodiment of the invention provides a touch-sensitive display device including a substrate, an OLED structure and a cover plate. The OLED structure is disposed on the substrate and includes a first electrode layer, a light-emitting layer and a second electrode layer. The first electrode layer is disposed on the substrate, the light-emitting layer is disposed on the first electrode layer, and the second electrode layer is disposed on the light-emitting layer and patterned to form a plurality of touch-sensing electrodes. The cover plate is disposed opposite the substrate and spaced at an interval from the substrate, and the OLED structure is sealed between the substrate and the cover plate. The first electrode layer may be an anode layer, and the second electrode layer may be a cathode layer.

In one embodiment, the touch-sensitive display device includes a plurality of pixels, and a distribution area of each of the touch-sensing electrodes covers multiple pixels.

In one embodiment, the touch-sensitive display device may include a plurality of partitioning structures for partitioning the second electrode layer to form the touch-sensing electrodes. Each of the partitioning structures is disposed in a gap between adjacent pixels.

In one embodiment, each of the touch-sensing electrodes is in the shape of a polygon, and the substrate is an active matrix TFT substrate.

In one embodiment, a cover lens is stacked on the cover plate, and a decoration layer is disposed on a periphery of the cover lens. The decoration layer may include at least one of diamond like carbon, ceramic, colored ink, resin and photo resist. The cover lens may be made of glass or plastic.

In one embodiment, each frame time is divided into a display period and a touch-sensing period, and at least one touch-sensing signal drives the touch-sensing electrodes only in the touch-sensing period.

In one embodiment, the touch-sensitive display device includes a plurality of pixels, each pixel may include a first switch, a second switch, a third switch and a fourth switch, one end of the OLED structure is connected to the first switch and the second switch in parallel, another end of the OLED structure is connected to the third switch and the fourth switch in parallel, the fourth switch is electrically connected to a touch-sensing signal, the first switch and the third switch are turned on and the second switch and the fourth switch are turned off during the display period, and the first switch and the third switch are turned off and the second switch and the fourth switch are turned on during the touch-sensing period. Further, each of the first switch, the second switch, the third switch and the fourth switch may be a thin film transistor.

In one embodiment, the second electrode layer is in a low voltage level and the first electrode layer is in a high voltage level during the display period, and the second electrode layer is in a high voltage level and the first electrode layer in a low voltage level during the touch-sensing period.

According to another embodiments of the invention, a fabrication method for a touch-sensitive display device including the steps of: providing a substrate; forming a first electrode layer and a light-emitting layer on the substrate; disposing multiple partitioning structures on the light-emitting layer; and forming a second electrode layer on the light-emitting layer. A height difference is formed between a part of the second electrode layer on the partitioning structures and another part of the second electrode layer not on the partitioning structures to partition the second electrode layer to form multiple disconnected segments. The first electrode layer may be an anode layer, and the second electrode layer may be a cathode layer.

According to the above embodiments, since a cathode layer of an OLED structure is patterned to form multiple touch-sensing electrodes, the cathode layer for a display structure and single-layered driving electrodes for a touch-sensing structure are both formed in the same process to simplify connection wiring and fabrication processes and thus reduce fabrication time and costs. Besides, since an external touch panel or touch-sensing electrode structure is no longer needed, the thickness and weight of a touch-sensitive display device are reduced and the overall light transmittance is enhanced. Further, since the cathode layer also functions as touch-sensing electrodes, a flexible printed circuit board needed for a touch-sensing electrode structure can be omitted from the touch-sensitive display device to further reduce fabrication costs.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

FIG. 2A shows a schematic plan view of a patterned cathode layer according to an embodiment of the invention.

FIG. 2B shows a schematic plan view of a patterned cathode layer according to another embodiment of the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
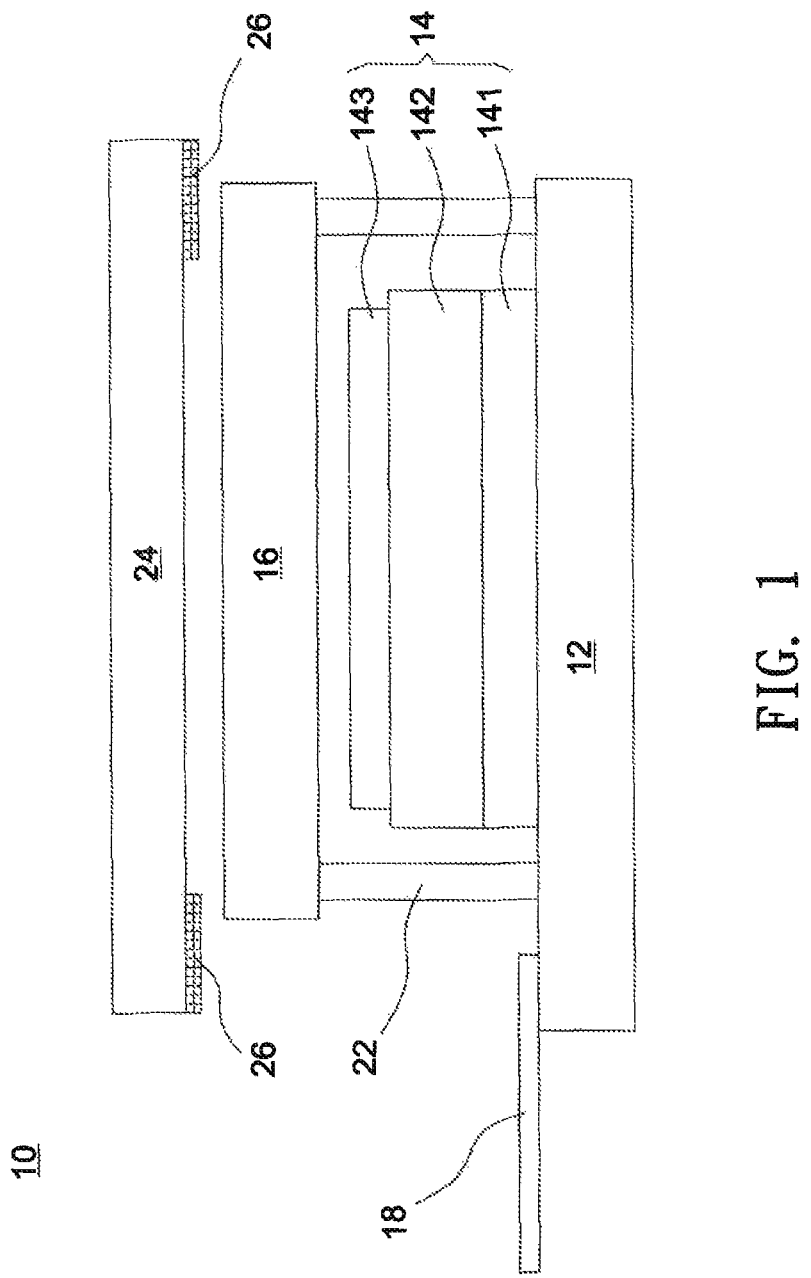
FIG. 1 shows a schematic diagram illustrating a touch-sensitive display device according to an embodiment of the invention.

Referring to FIG. 1, a touch-sensitive display device 10 includes a substrate 12, an organic light-emitting diode (OLED) structure 14, and a cover plate 16. The OLED structure 14 is disposed on the substrate 12, the substrate 12 may be an active matrix TFT substrate, and the wiring on the substrate 12 is connected to a signal source (not shown) via a flexible printed circuit board 18. The cover plate 16 is disposed opposite the substrate 12 and spaced at an interval from the substrate 12. The OLED structure 14 is sealed between the substrate 12 and the cover plate 16 by a sealant 22, and a filler (not shown) may be optionally disposed in a space defined by the sealant 22, the cover plate 16 and the substrate 12. A cover lens 24 may be stacked on the cover plate 16, and a decoration layer 26 may be formed on a periphery of the cover lens 24 to shield metal traces. The decoration layer 26 may include at least one of diamond like carbon, ceramic, colored ink, resin and photo resist, and the cover lens 24 may be made of glass or plastic. In an alternate embodiment, the cover lens 24 may be omitted from the touch-sensitive display device 10, and the decoration layer 26 is directly formed on the cover plate 16. The OLED structure 14 may include an anode layer 141, a light-emitting layer 142 and a cathode layer 143. The anode layer 141 is disposed on the substrate 12, the light-emitting layer 142 is disposed on the anode layer 141, and the cathode layer 143 is disposed on the light-emitting layer 142. In this embodiment, the cathode layer 143 is patterned to form multiple single-layered touch-sensing electrodes 143a. The touch-sensing electrodes 143a are not limited to a specific shape, and, for example, the touch-sensing electrodes 143a may be in the shape of a polygon such as a triangle (FIG. 2A) or a rectangle (FIG. 2B). Note a person skilled in the art may realize that, in an alternate embodiment, the anode layer 141 but not the cathode layer 143 may be patterned to form multiple touch-sensing electrodes.

Figure 3A:
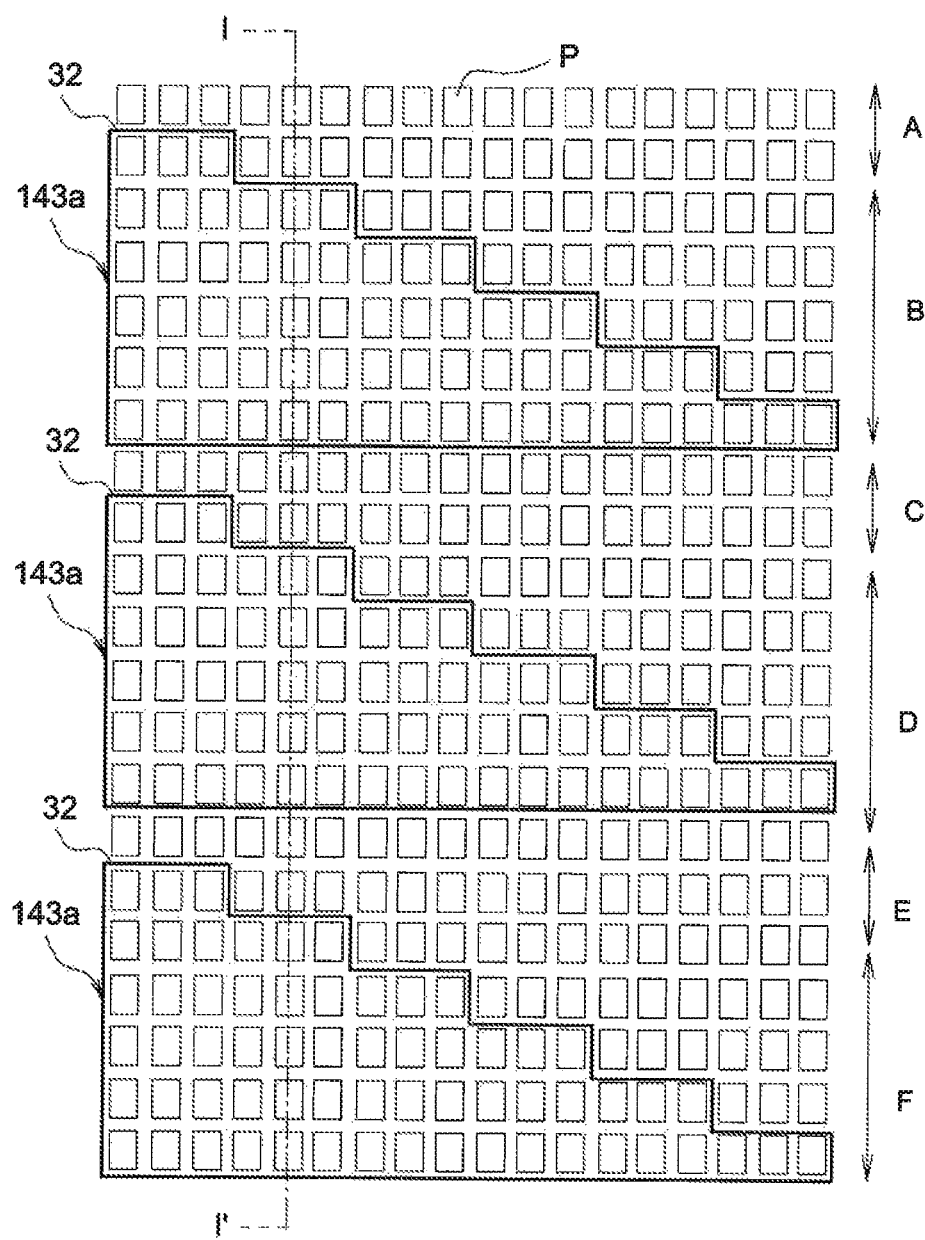
FIG. 3A and FIG. 3B are schematic diagrams illustrating a process of patterning a cathode layer according to an embodiment of the invention.
Figure 3B:
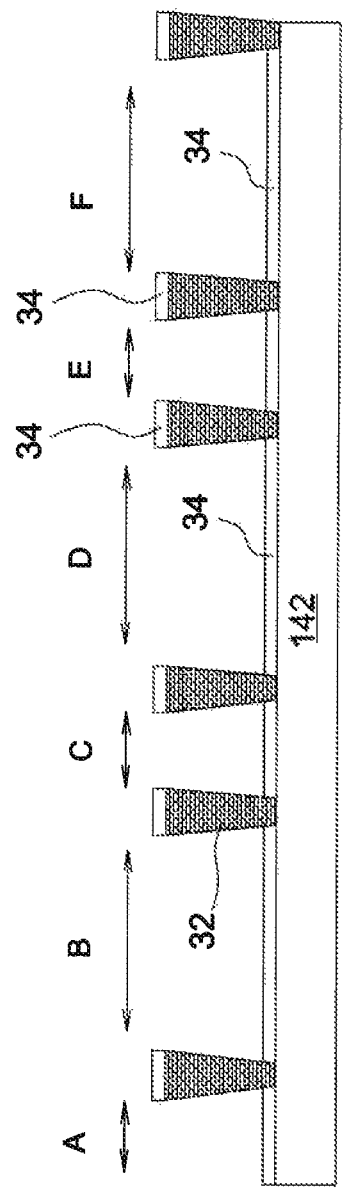

FIG. 3A and FIG. 3B are schematic diagrams illustrating a process of patterning a cathode layer according to an embodiment of the invention, where FIG. 3B is a schematic cross-section of FIG. 3A cut along line I-I'. Please refer to both FIG. 3A and FIG. 3B, the touch-sensitive display device 10 includes multiple red, green and blue pixels P. The cathode layer 143 is formed from a transparent conductive film 34. Specifically, a plurality of partitioning structures 32 are used to partition the transparent conductive film 34 to form the patterned cathode layer 143 and multiple touch-sensing electrodes 143a as a result. As shown in FIG. 3A, the touch-sensitive display device 10 includes multiple pixels P, each partitioning structure 32 is disposed in a gap between adjacent pixels P, and a distribution area of each touch-sensing electrode 143a (an area surrounded by boldfaced lines) covers multiple pixels P. As shown in FIG. 3B, the partitioning structure 32 may be a rib structure. Since multiple partitioning structures 32 are disposed on the light-emitting layer 142, a height difference is formed between apart of the transparent conductive film 34 on the partitioning structures 32 and another part of the transparent conductive film 34 not on the partitioning structures 32 when the transparent conductive film 34 is deposited on the light-emitting layer 142. Under the circumstance, the partitioning structure 32 is allowed to partition the transparent conductive film 34 to form multiple disconnected regions A-F for spreading touch-sensing electrodes. Therefore, according to the above embodiments, a fabrication method for a touch-sensitive display device is described below. First, a substrate 12 such as an active matrix TFT substrate is provided. Then, an anode layer 141 and a light-emitting layer 142 are formed on the substrate 12, and multiple partitioning structures 32 are disposed on the light-emitting layer 142. Finally, a cathode layer 143 is formed on the light-emitting layer 142. Since a height difference is formed between apart of the cathode layer 143 on the partitioning structures 32 and another part of the cathode layer 143 not on the partitioning structures 32, the cathode layer 143 is allowed to be partitioned to form multiple disconnected segments, and these disconnected segments serve as touch-sensing electrodes 143a for touch-sensing operations.

Figure 4:
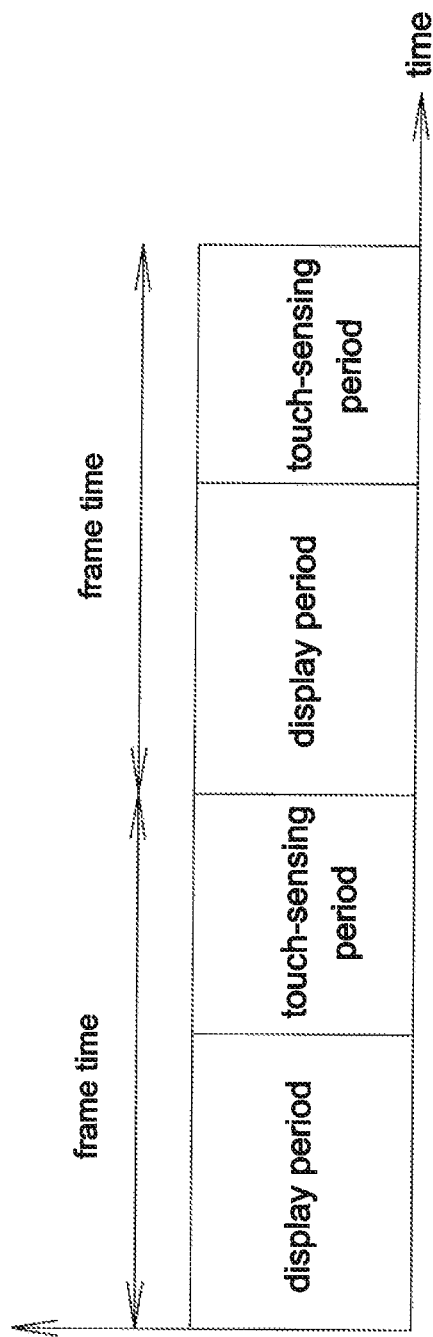
FIG. 4 shows a schematic diagram illustrating a display scheme and a touch-sensing scheme of a touch-sensitive display device according to an embodiment of the invention.
Figure 5:
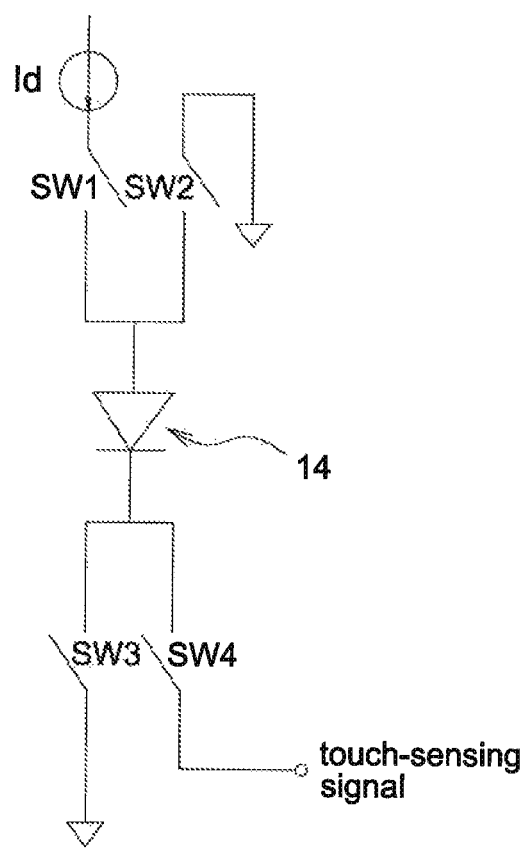
FIG. 5 shows a schematic diagram illustrating a pixel circuit according to an embodiment of the invention.

Since the cathode layer 143 may serve as both a part of a display structure and a part of a touch-sensing structure, the touch-sensitive display device 10 needs both a display scheme and a touch-sensing scheme independent of the display scheme to operate. Therefore, as shown in FIG. 4, each frame time is divided into a display period and a touch-sensing period. For example, during the display period, the voltage level supplied on the cathode (cathode layer 143) of the touch-sensitive display device 10 is 0V or a negative voltage, and the anode (anode layer 141) of the touch-sensitive display device 10 has a voltage equal to the image data voltage. During the touch-sensing period, the cathode of the touch-sensitive display device 10 is electrically connected to a touch-sensing signal, and the voltage level supplied on the anode of the touch-sensitive display device 10 is 0V. The switch between a display scheme and a touch-sensing scheme may be achieved by a pixel circuit shown in FIG. 5. As shown in FIG. 5, one end of the OLED structure 14 is connected to a switch SW1 and a switch SW2 in parallel, another end of the OLED structure 14 is connected to a switch SW3 and a switch SW4 in parallel, and the switch SW4 is electrically connected to a touch-sensing signal. During the display period, the switch SW1 and the switch SW3 are turned on, and the switch SW2 and the switch SW4 are turned off. Therefore, a current Id in respond to image data may flow through the switch SW1 and the switch SW3 and enter the OLED structure 14 to generate specific brightness levels in respond to image data. During the touch-sensing period, the switch SW1 and the switch SW3 are turned off, and the switch SW2 and the switch SW4 are turned on. Therefore, the OLED structure 14 is reversely biased and turned off, and the switch SW4 is turned on to allow the touch-sensing signal to drive each of the touch-sensing electrodes 143a. Under the circumstance, the voltage variation on each touch-sensing electrode 143a due to coupling capacitance is detected, where the coupling capacitance is formed as a result of a touch operation, and detection results are transmitted to a signal processing unit such as an IC (not shown) to thereby sense touch positions. Besides, the switch SW2 is turned on and hence grounded to prevent the touch-sensing electrodes 143a of the OLED structure 14 in operation from suffering signal interference. In one embodiment, each of the switches SW1-SW4 may be a thin film transistor.

According to the above embodiments, since a cathode layer of an OLED structure is patterned to form multiple touch-sensing electrodes, the cathode layer for a display structure and single-layered driving electrodes for a touch-sensing structure are both formed in the same process to simplify connection wiring and fabrication processes and thus reduce fabrication time and costs. Besides, since an external touch panel or touch-sensing electrode structure is no longer needed, the thickness and weight of a touch-sensitive display device are reduced and the overall light transmittance is enhanced. Further, since the cathode layer also functions as touch-sensing electrodes, a flexible printed circuit board needed for a touch-sensing electrode structure can be omitted from the touch-sensitive display device to further reduce fabrication costs.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims. Each of the terms "first" and "second" is only a nomenclature used to modify its corresponding element. These terms are not used to set up the upper limit or lower limit of the number of elements.

What is claimed is:
1. A touch-sensitive display device, comprising:
a substrate;
an OLED structure disposed on the substrate, wherein the OLED structure comprises:
  a first electrode layer disposed on the substrate;
  a light-emitting layer disposed on the first electrode layer; and
  a second electrode layer disposed on the light-emitting layer and patterned to form a plurality of touch-sensing electrodes; and
a cover plate disposed opposite the substrate and spaced at an interval from the substrate, and the OLED structure being sealed between the substrate and the cover plate, wherein each frame time for the touch-sensitive display device is divided into a display period and a touch-sensing period, the touch-sensitive display device comprises a plurality of pixels, each pixel comprises a first switch, a second switch, a third switch and a fourth switch, one end of the OLED structure is connected to the first switch and the second switch in parallel, another end of the OLED structure is connected to the third switch and the fourth switch in parallel, the fourth switch is electrically connected to a touch-sensing signal, the first switch and the third switch are turned on and the second switch and the fourth switch are turned off during the display period, and the first switch and the third switch are turned off and the second switch and the fourth switch are turned on during the touch-sensing period.
2. The touch-sensitive display device as claimed in claim 1, wherein each of the first switch, the second switch, the third switch and the fourth switch is a thin film transistor.

* * * * *